United States Patent [19]
Jörg

[11] Patent Number: 5,877,646
[45] Date of Patent: Mar. 2, 1999

[54] METHOD FOR THE TURN-ON REGULATION OF AN IGBT AND APPARATUS FOR CARRYING OUT THE METHOD

[75] Inventor: Pieder Jörg, Domat/Ems, Switzerland

[73] Assignee: ABB Research Ltd, Zurich, Switzerland

[21] Appl. No.: 792,232

[22] Filed: Jan. 31, 1997

[30] Foreign Application Priority Data

Mar. 20, 1996 [DE] Germany .................. 196 10 895.0

[51] Int. Cl.⁶ ............................................. H03K 17/04
[52] U.S. Cl. ........................ 327/374; 327/380; 327/381
[58] Field of Search ................................. 327/110, 374, 327/375, 376, 377, 379, 380, 381

[56] References Cited

U.S. PATENT DOCUMENTS 5,581,208  12/1996  Gaubatz ................................ 327/110

FOREIGN PATENT DOCUMENTS

| 0690572A2 | 1/1996 | European Pat. Off. . |
| 3723786A1 | 1/1989 | Germany . |
| 63-95727 | 4/1988 | Japan . |
| 4-337919 | 11/1992 | Japan . |
| 5-327440 | 12/1993 | Japan . |

OTHER PUBLICATIONS

"Optimization of the Short–Circuit Behaviour of NPT–IGBT by the Gate Drive", Eckel, et al., EPE '95 Meeting, Sevilla, pp. 2.213–2.218.

"High Power IGBT Converters with new Gate Drive and Protection Circuit", Gediga, et al., EPE '95 Meeting, Sevilla, pp. 1.066–1.070.

"An Experimentally Verified IGBT Model Implemented in the Saber Circuit Simulator", Hefner, Jr., et al., IEEE Transactions on Power Electronics, vol. 9, No. 5, Sep. 94, pp. 532–542.

Primary Examiner—Timothy P. Callahan
Assistant Examiner—Jeffrey Zweizig
Attorney, Agent, or Firm—Burns, Doane, Swecker & Mathis, LLP

[57] ABSTRACT

A method for the turn-on regulation of an IGBT and an apparatus for carrying out the method are specified. In contrast to the prior art, the gate current is used as controlled variable rather than the gate voltage. Said gate current acts on the gate electrode according to a desired-actual comparison of an actual voltage value present at the gate electrode and of a corresponding desired value. The regulation guides the load current on a predetermined trajectory during the switching operation. Nevertheless, no current detection is necessary on the load side. Instead, use is made of the fact that, during the turn-on of the MOSFETs in the IGBT, the behavior of the latter predominates. It can be shown that there is a quadratic relationship between the gate voltage and the load current as soon as the gate voltage is greater than the threshold voltage. This is true until the full load current flows. Regulation of the gate voltage to a specific trajectory from the off state to the on state enables the load current to rise quadratically proportionally thereto. Conversely, the gate voltage profile can easily be calculated to a desired load current profile. The fact that no measuring apparatuses on the load side are required is also particularly advantageous.

9 Claims, 2 Drawing Sheets

METHOD FOR THE TURN-ON REGULATION OF AN IGBT AND APPARATUS FOR CARRYING OUT THE METHOD

BACKGROUND OF THE INVENTION

Field of the Invention

The invention is concerned with the field of power electronics. It is based on a method for the turn-on regulation of a bipolar transistor having an insulated gate electrode (IGBT) according to the preamble of the first claim. Moreover, it relates to an apparatus for carrying out the method.

Discussion of Background

Such a method and a corresponding apparatus are described, for example, in the articles "Optimization of the Short-Circuit Behavior of NPT–IGBT by the Gate Drive", EPE '95, Seville, pages 2.213–2.218, by H.-G. Eckel and L. Sack and "High Power IGBT Converters with new Gate Drive and Protection Circuit", EPE '95, pages 1.006–1.070, by S. Gediga, R. Marquardt, R. Sommer.

Such an apparatus is part of a so-called gate drive. It is used to drive the IGBT, that is to say it supplies the required turn-on and turn-off pulses. A further important task of the gate drive is to protect the IGBT against excessive voltages or currents in all operating states. This also includes, in particular, limiting the rates of current and voltage rise. Restricting the rate of current rise also serves to protect the diode which also takes part in the switching operation. Known gate drives such as those in the aforementioned article "Optimization of the Short-Circuit . . .", for example, essentially comprise a voltage source which can supply two voltages, one for the on state (typically 15 V) and one for the off state (typically –15 V). This binary voltage source is connected to the IGBT gate via a resistor, which limits the current into the gate. To turn the IGBT on, the source is switched over from the negative voltage directly to the positive voltage. The gate, which can be regarded as a capacitance, is charged. The higher the gate voltage has risen, the smaller the gate current becomes and the slower the gate voltage rises. In order to limit the rate of rise of the anode-cathode current, an attempt is made to detect said rate of rise on the load side, usually by measuring the voltage drop across a parasitic inductance which is present in any case. With suitable feedback, current is drawn past the gate generally by opening a parallel path, which slows down the charging operation. The disadvantage of this solution is that an additional sensor on the load side is necessary. Moreover, the signal obtained is small and thus susceptible to interference. The oxide capacitance of the IGBT is usually charged very slowly during the turn-on operation, since in this case the current-driving difference across the gate resistor is small. The associated rate of voltage reduction on the load side is difficult to control and is usually too slow.

In the second article "High Power IGBT Converters . . . ", an attempt is made to avoid this additional sensor by impressing a predetermined voltage-time function during the turn-on operation. However, the voltage source is still connected to the IGBT gate via a relatively large resistor. As a result, the actual voltage at the gate significantly lags behind the impressed voltage-time function.

SUMMARY OF THE INVENTION

Accordingly, one object of the invention is to provide a novel method and an apparatus for carrying out the method which have the simplest possible structure and can keep the IGBT in the SOA (Safe Operating Area) in all operating states during the turn-on operation, without necessitating limiting or monitoring devices on the load side. In addition, the method is intended to permit regulation of the rate of current rise during the turn-on operation (di/dt), to be precise without any current detection on the load side.

This object is achieved, in the case of a method of the type mentioned in the introduction, by means of the features of the first claim.

The core of the invention, then, is that, in contrast to the prior art, the gate current is used as controlled variable rather than the gate voltage. Said gate current acts on the gate electrode according to a desired-actual comparison of an actual voltage value present at the gate electrode and of a corresponding desired value. The regulation guides the load current on a predetermined trajectory during the switching operation. Nevertheless, no current detection is necessary on the load side. Instead, use is made of the fact that, during the turn-on of the MOSFETs in the IGBT, the behavior of the latter predominates. It can be shown (see below) that there is a quadratic relationship between the gate voltage and the load current as soon as the gate voltage is greater than the threshold voltage. This is true until the full load current flows. Regulation of the gate voltage to a specific trajectory from the off state to the on state enables the load current to rise quadratically proportionally thereto. Conversely, the gate voltage profile can easily be calculated to a desired load current profile.

The gate of the IGBT is an electrical capacitance, at which the voltage must then be regulated. The controlled variable may be only the current into the gate. A simple proportional regulator suffices as regulation arrangement. The gate current is then proportional to the difference between the desired and the actual gate voltage. In the circuitry implementation, a function generator is connected via a comparator and a proportional regulator to a voltage-controlled current source. The function generator is controlled along a selected curve. The current source driven in this way impresses the desired control current into the gate of the IGBT.

In addition to the complete control over the current rise during the turn-on operation, the invention also affords advantages for the remaining operating states. The charging of the gate up to the threshold voltage can be effected very rapidly because this has no influence on the load side. Once the IGBT has accepted the full load current, by limiting the gate current it is also possible to limit the rate of load-side voltage change at the IGBT (turn-on du/dt), because the oxide capacitance is charged more slowly with a smaller gate current. Finally, by prescribing suitable desired gate voltage profiles, it is also possible to influence the voltage rise during the turnoff operation of the IGBT.

Further exemplary embodiments emerge from the corresponding dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
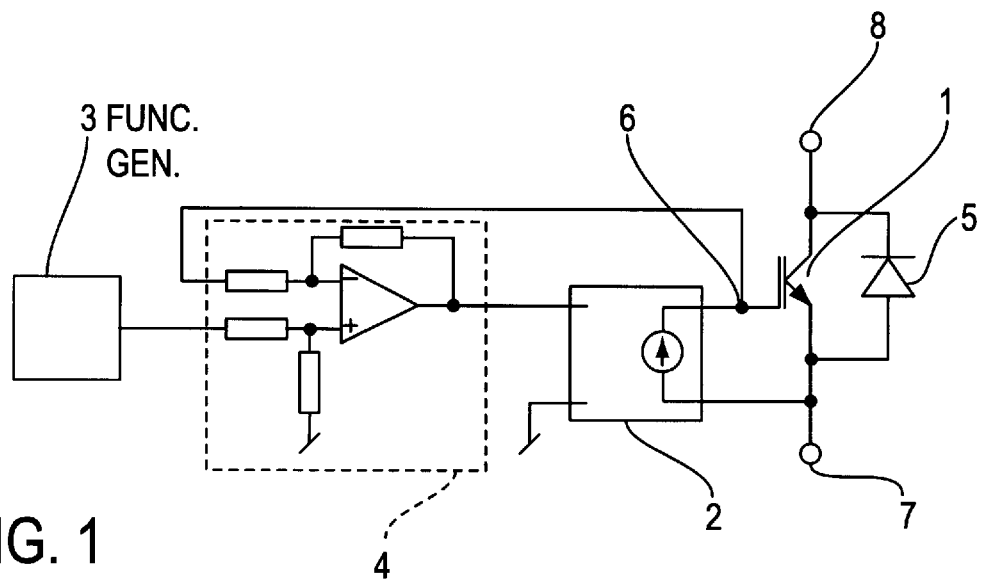
FIG. 1 shows an equivalent circuit diagram of an apparatus which can be used to carry out the method according to the invention.

The reference numerals used in the drawings and their meaning are summarized in the List of Designations.

DESCRIPTION OF THE PREFERRED EMBODIMENTS

The invention is based on a non-trivial, detailed analysis of an IGBT model. An T!GT model is described, for example, in the article "An Experimentally Verified IGBT Model Implemented in the Saber Circuit Simulator", IEEE Trans. on Power Electronics, Vol. 9, September 1994, by A. R. Hefner and D. M. Diebolt. All of the equations used below can, moreover, be found in this publication.

Figure 2:
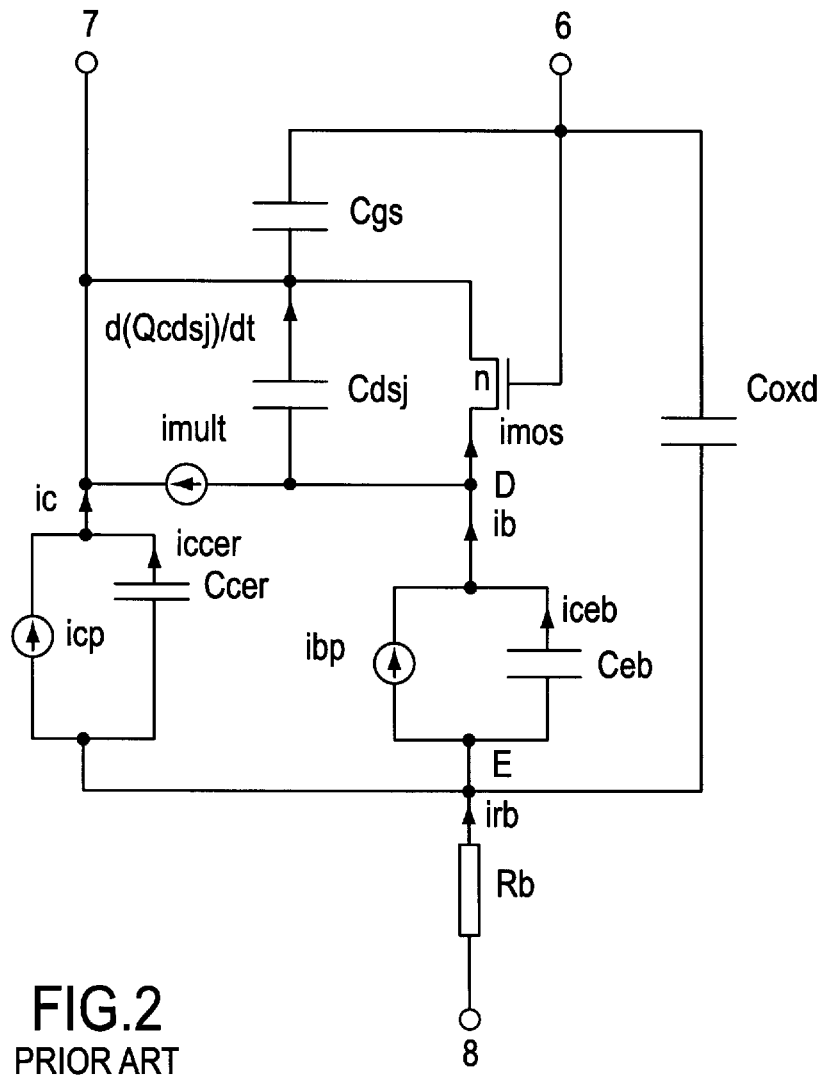
FIG. 2 shows an equivalent circuit diagram of an IGBT model.

Referring now to the drawings, wherein like reference numerals designate identical or corresponding parts throughout the several views, in FIG. 2 an attempt is made to visualize the model equations by means of an electrical network. The designations of the elements and currents essentially correspond to those of the publication cited above. The impressed currents, in particular, are, however, extremely nonlinear. The model has six electrical nodes, at which Kirchhoff's equations must be satisfied. The load current is composed of the partial currents which flow from the bipolar emitter directly to the cathode and of those which flow from the bipolar emitter via the MOS drain (=bipolar base) to the cathode. The former is also referred to in its entirety as bipolar current, and the latter as MOS current.

The MOS current is considered first. According to FIG. 2, it is composed of two parts: the so-called emitter-base DC current $i_{bp}$ and a displacement current due to base charge changes $i_{ceb}$, Their sum is designated as $i_b$. Owing to the node law, the current $i_b$ must be equal to the current from the drain D to the cathode 7. The latter current is also composed of three parts: the actual current in the MOS channel $i_{mos}$, the current $i_{mult}$, which reflects charge carrier multiplication due to sudden ionization in the high electric field, and the displacement current in the drain-source capacitance $d(Q_{cdsj})/dt$. The current $i_{mos}$ is clearly decisive, the current $i_b$ is thus virtually equal to $i_{mos}$.

The bipolar current is considered secondly: it is the sum of the emitter-collector DC current $i_{cp}$ and the redistribution current icce. The current $i_{ccer}$ can be ignored during the turn-on operation. The current $i_{cp}$ must again be analyzed individually.

$$i_{cp} = \left(\frac{1}{1+b}\right) i_{rb} + \left(\frac{b}{1+b}\right) \frac{4D_p}{W^2} Q_{ceb} \quad (1)$$

where b: ambipolar mobility ratio
Dp: hole diffusion constant
W=W(t): width of the neutral base
$Q_{ceb}=Q_{ceb}(t)$: Emitter-base charge According to Eq. (1), $i_{cp}$ is composed of a component which reflects the coupling between hole and electron current (left-hand summand) and a charge-determined component (right-hand summand). The right-hand summand has a proportion of about 10% of the total load current.

From these observations, it follows that, for the design of the regulator, the load current during the turn-on operation is determined as the sum of the current in the MOS channel $i_{mos}$ and that component of the bipolar current (left-hand summand in (1)) which is determined by the coupling of the hole and electron transport. All other influences are interpreted as disturbance variables.

The relationship between the MOS current and the bipolar current icp* which has been considered is investigated next.

From (1), ignoring the right-hand summand (2), $$i_{cp}^* = \left(\frac{1}{1+b}\right) i_{rb} \quad (2)$$

The MOS current imos and the bipolar current icp are added at the emitter node E (cf. FIG. 2) to give irb (Equation (3))

$$i_{rb} = i_{cp}^* + i_{mos} \quad (3)$$

Solving (2) for $i_{rb}$ and insertion into (3) with subsequent solving for $i_{mos}$ gives Equation (4).

$$i_{mos} = \frac{1}{b} \cdot i_{cp} \quad (4)$$

According to Equation (5), the total current is associated with the MOS current. Accordingly, the two currents are linearly proportional to one another.

$$i_{rb} = \frac{1}{b} i_{mos} + i_{mos} = \left(\frac{1+b}{b}\right) i_{mos} \quad (5)$$

The IGBT is controlled from the gate. For this reason, a search will be made below for a relationship between the gate variables and the load current which can be used for the regulation. The "inner" MOSFET of the IGBT is in the saturation condition during the rising slope of the load current. The known quadratic relationship according to Equation (6) between the gate voltage and the MOS channel current holds true. Note that the gate voltage in this phase is already greater than the threshold voltage.

$$i_{mos} = K_p (v_{gs} - v_t)^2 \frac{1}{2} \quad (6)$$

where $K_p$: MOS transconductance in the saturation region
   $V_t$: threshold voltage of the MOSFET
   $V_{gs}$: gate voltage Insertion of (6) into (5) gives a simple quadratic relationship (7) between the load current and the gate voltage which holds true during the turn-on phase.

$$i_{rb} = \left(\frac{1+b}{b}\right) K_p (v_{gs} - v_t)^2 \frac{1}{2} \quad (7)$$

Conclusions for regulation;

Controlling the gate voltage enables the load current to be regulated during the rise. Measuring the transconductance against the series leakage inductance in the load circuit is omitted. The regulation problem must now be put differently: the current into the gate of the IGBT serves as controlled variable, whereas the gate voltage, which after all controls the IGBT, is the variable to be regulated. It is pointed out that the regulation object to be achieved involves a so-called tracking task, in contrast to regulation to an operating point. It is necessary, then, to find a suitable trajectory along which the regulator must effect guidance. However, this also constitutes an additional degree of freedom for the design of the circuitry.

With the gate current as the controlled variable, it is therefore necessary to regulate the gate voltage. This regulated system constitutes an integrator, formed by the gate-source capacitance of the MOSFET and by the oxide capacitance. However, the oxide capacitance has an influence only at the end of the turn-on operation. A proportional regulator may be used as the regulator. The resulting closed-loop system is a first-order closed-loop system, with the result that no oscillations are possible either. The gain of the proportional regulator is limited by the maximum gate current which can be supplied.

FIG. 1 shows an exemplary embodiment of such a regulating apparatus. 1 designates the IGBT, with which a freewheeling diode 5 is reverse-connected in parallel. These two elements may be part of a power electronic circuit such as, for example, a bridge-connected polyphase converter. A highly inductive drive motor is used, for example, as the load of this circuit.

The control electrode or gate electrode 6 of the IGBT 1 is fed by a voltage-controlled current source 2. The latter is arranged between the gate electrode 6 and the cathode electrode 7 of the IGBT 1. The controlling voltage is formed by the output voltage of a differential amplifier. The differential amplifier 4 forms a comparator and a proportional regulator. A gate voltage is measured at the gate electrode 6 of the IGBT 1 and is compared with a voltage trajectory which is predetermined by a function generator 3. The result of this desired value-actual value comparison is amplified in the proportional regulator and serves to drive the current source 2.

Different variants of suitable trajectories are presented below: a current rise of approximately 0.8 kA/$\mu$s is to be achieved. The rise in the voltage from -15. V (IGBT in the off state) up to the threshold voltage of, for example, 7 V can be selected freely, since it has no influence on the load side. At most, the maximum gate current which can be supplied by the current source acts as a limiting factor here. The voltage rise in this region can consequently rise linearly in, for example, 3 $\mu$s from -15 V to 7 V. The manner in which the gate voltage rises further from the threshold voltage up to the voltage at which the IGBT has accepted the full current, the latter voltage being 10 V to 11 V depending on the type and application, determines the behavior of the current on the load side. The simplest case is to allow the gate voltage to rise linearly. The load current then rises quadratically. In order to achieve a rate of rise of approximately 0.8 kA/$\mu$s, the gate voltage for a 2.5 kV IGBT must rise from 6.5 V to 10.5 V in 3 $\mu$s. The further rise up to the steady-state voltage in the on state at 15 V significantly influences the rate of the voltage drop in the IGBT. In this case, it is also possible to use a straight line which is selected to be steeper, the higher the rate of the voltage drop across the IGBT is permitted to be. This typically has the same steepness or is slightly shallower than in the middle section since, in particular, the gate voltage is also dependent on the load current during the transition from the last section to this section.

Figure 3:
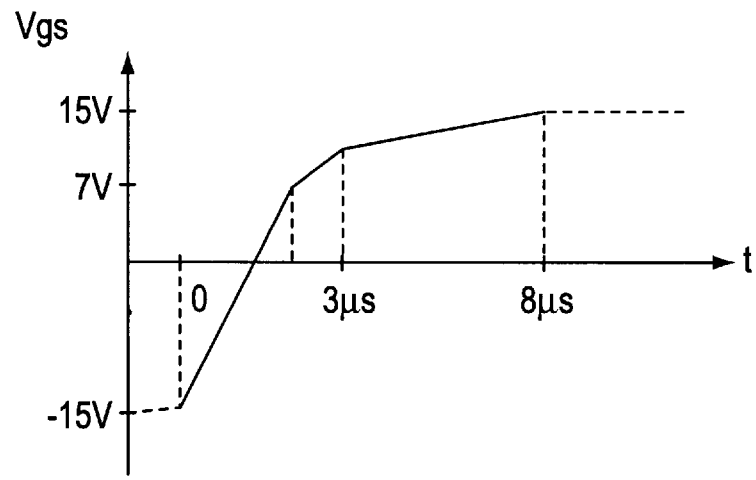
FIGS. 3–5 show various voltage-time functions.

According to the example explained above, then, the voltage trajectory forms three straight lines (FIG. 3). The first straight line rises from -15 V up to the threshold voltage. The second straight line begins at the threshold voltage and rises up to a gate voltage at which the IGBT is completely switched on.

The third straight line then subsequently rises up to 15 V. A further variant is to combine the first two sections into a rise of the form $$(1-e^{-\frac{t}{\tau}}).$$

Figure 4:
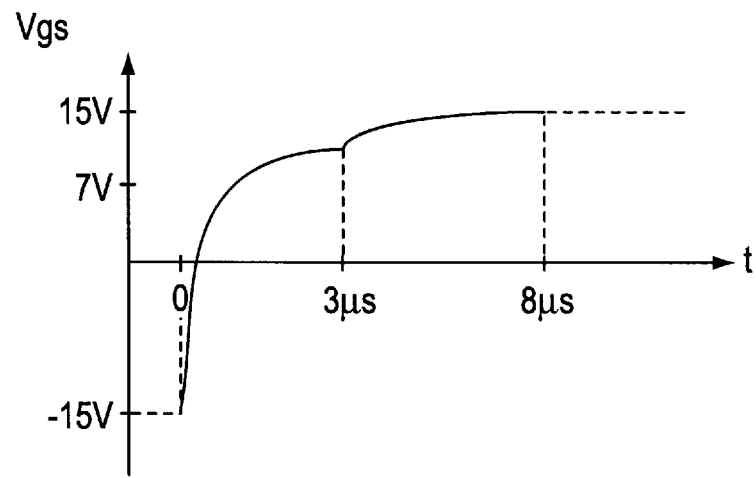
Figure 5:
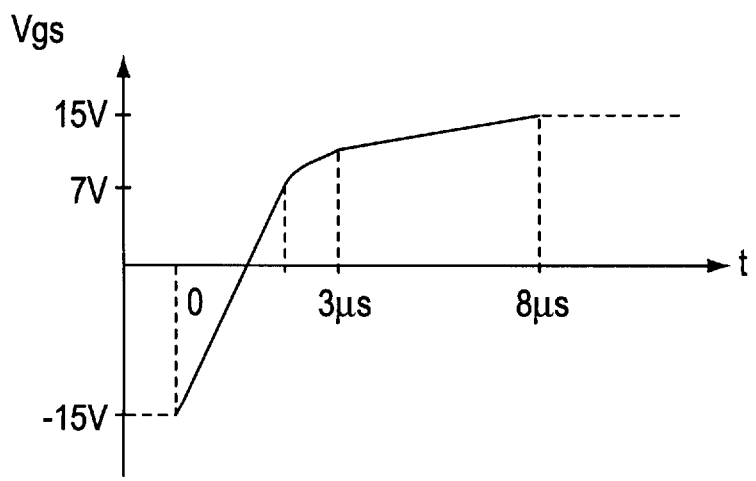

This curve leads the gate rapidly to the threshold voltage. In addition, it guides the load current in such a way that the rise in the lower region is steeper than in the upper region. As a result, it is possible to minimize the power loss while simultaneously protecting the diode. For the sake of simplicity, the third section will then likewise have a $$(1-e^{-\frac{t}{\tau}})$$

form (FIG. 4). As a further variant, a profile in the form of a root function is also conceivable in the middle section (FIG. 5). This variant is distinguished, in particular, by a minimization of the power loss which is proportional to the area under the current curve.

The function generator for generating the abovementioned voltage trajectories may have a digital or analog structure. In the case of an analog structure, the $$(1-e^{-\frac{t}{\tau}})$$

form, in particular, may be used since this can be realized in a simple manner by charging capacitors. The root form can also be realized in the case of a digital structure, for example by means of a stored function table in the form of a look-up table.

Overall, then, the invention makes available a method for the turn-on regulation of an IGBT and a corresponding apparatus which achieves current rise limiting in a simple manner in terms of circuitry without current or voltage measurement on the load side.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for the turn-on regulation of a bipolar transistor having an insulated gate electrode (IGBT), wherein the gate electrode is acted on by a control current which is formed according to a desired-actual comparison of an actual voltage value present at the gate electrode and of a predetermined desired value, and wherein a voltage rise function is predetermined as the desired value, the voltage rise function essentially comprising three parts, a voltage in the first part rising up to a threshold of the IGBT, a voltage in the second part rising from the threshold voltage up to a value of the gate voltage at which the IGBT has accepted a full load current, and a voltage in a third part rising up to a maximum value of the gate voltage.

2. The method as claimed in claim 1, wherein the three parts have a rise in the form of a ramp, wherein a gradient of the first part is greater than that of the second and third parts.

3. The method as claimed in claim 1, wherein the first and second parts are realized by a joint rise in the form of a $$(1-e^{-\frac{t}{\tau}})$$

function, and wherein the third part has the form of a function $$(1-e^{-\frac{t}{\tau}}),$$

and wherein the gradient of the first part is greater than that of the second part.

4. The method as claimed in claim 3, wherein the first part and the third part have a rise in the form of a straight line, while the second part has the form of a square root function.

5. An apparatus for the turn-on regulation of a bipolar transistor having an insulated gate electrode (IGBT), comprising:
- a gate electrode acted on by a control current formed according to a desired-actual comparison of an actual voltage value present at the gate electrode and of a predetermined desired value;
- a voltage-controlled current source provided between the gate electrode and a cathode electrode of the IGBT; and
- a function generator whose output is connected to a first input of a comparator, the voltage present at the gate electrode being applied to a second input of the comparator, and an output of the comparator being connected via a proportional regulator to the control input of the voltage-controlled current source, wherein the comparator and the proportional regulator are integrated in a differential amplifier.

6. The apparatus as claimed in claim 5, wherein the function generator generates a voltage rise function which essentially comprises at least two parts, a voltage in the first part rising up to a threshold voltage of the IGBT, and a voltage in the second part rising from the threshold voltage up to a maximum value of the gate voltage.

7. The apparatus as claimed in claim 6, wherein the voltage rise function comprises three parts, the three parts having a rise in the form of a ramp, wherein the gradient of the first part is greater than that of the second and third parts.

8. The apparatus as claimed in claim 6, wherein the voltage rise function comprises three parts, the first and second parts being realized by a common rise in the form of a $$(1 - e^{-\frac{t}{\tau}})$$

function, and wherein the third part has the form of a $$(1 - e^{-\frac{t}{\tau}})$$

function, and wherein the gradient of the first part is greater than that of the second part.

9. The apparatus as claimed in claim 6, wherein the voltage rise function comprises three parts, the first part and the third part having a rise in the form of a straight line, while the second part has the form of a square root function.

* * * * *